United States Patent [19]

Yamanishi et al.

[11] Patent Number: 5,389,446
[45] Date of Patent: Feb. 14, 1995

[54] COPPER FOIL FOR PRINTED CIRCUITS

[75] Inventors: Keisuke Yamanishi; Kazuhiko Sakaguchi, both of Hitachi, Japan

[73] Assignee: Nikko Gould Foil Co., Ltd., Tokyo, Japan

[21] Appl. No.: 17,587

[22] Filed: Feb. 16, 1993

[30] Foreign Application Priority Data

Feb. 19, 1992 [JP] Japan .................. 4-069807

[51] Int. Cl.$^6$ .............................................. C23C 16/06
[52] U.S. Cl. ..................... 428/472; 428/637; 428/656; 428/658; 428/675; 428/676; 428/701; 428/702
[58] Field of Search ............... 428/637, 656, 658, 675, 428/676, 472, 701, 702

[56] References Cited

U.S. PATENT DOCUMENTS

| | | | |
|---|---|---|---|
| 3,585,010 | 6/1971 | Luce et al. | 29/191.2 |
| 4,077,052 | 2/1978 | Vossen, Jr. | 428/675 |
| 4,131,517 | 12/1978 | Mitsuo et al. | 204/27 |
| 4,154,139 | 5/1979 | Hage | 428/658 |
| 4,387,006 | 6/1983 | Kajiwara et al. | 204/32 |
| 4,483,906 | 11/1984 | Nakatsugawa | 428/675 |
| 4,491,622 | 1/1985 | Butt | 428/472 |
| 4,503,112 | 3/1985 | Konicek | 428/675 |
| 4,532,190 | 7/1985 | Kanabe et al. | 428/675 |
| 4,572,768 | 2/1986 | Wolski et al. | 428/658 |
| 4,619,871 | 10/1986 | Takami | 428/675 |
| 4,659,436 | 4/1982 | Kaylor | 428/675 |
| 4,707,416 | 11/1987 | Ebata et al. | 428/676 |
| 5,010,222 | 5/1991 | Hino et al. | 204/27 |
| 5,022,968 | 6/1991 | Lin et al. | 204/28 |
| 5,137,791 | 8/1992 | Swischer | 428/675 |

FOREIGN PATENT DOCUMENTS

| | | |
|---|---|---|
| 0396056 | 11/1990 | European Pat. Off. . |
| 57-152490 | 9/1982 | Japan . |
| 58-7077 | 2/1983 | Japan . |
| 58-15950 | 3/1983 | Japan . |
| 9176798 | 2/1991 | Japan . |

OTHER PUBLICATIONS

Patent Abstract of Japan, vol. 015, No. 068 (C-0807) (1991) & JP-A-22 94 490 (1990).
World Patet Index, Section Ch, Week 8135, AN 81-63507D & JP-A-56 087 677 (1981).

*Primary Examiner*—A. A. Turner
*Attorney, Agent, or Firm*—Seidel, Gonda, Lavorgna & Monaco

[57] ABSTRACT

There is provided a copper foil for printed circuits characterized by having a coating layer which contains zinc and zinc oxide, chromium oxide and nickel, and either or both of zinc and zinc oxide at least on the shiny side of a copper foil. The coating layer is formed by electroplating using a plating solution which contains either or both of zinc salt and zinc oxide, chromic salt and nickel salt. This copper foil resists discoloration upon exposure to high-temperature conditions of 180° C. for 30 minutes. Resist adhesion is also good. The amounts of deposits are preferably 60 to 80 μg Zn, 30 to 40 μg Cr and 5 to 20 μg Ni per dm$^2$. The matt side of the copper foil may be treated to form thereon a single metal layer or alloy layer of one or more metals chosen from among Cu, Cr, Ni, Fe, Co, and Zn. The copper foil is suited for the fabrication of printed circuits with fine circuit patterns.

4 Claims, No Drawings

COPPER FOIL FOR PRINTED CIRCUITS

FIELD OF THE INVENTION

This invention relates to a copper foil for printed circuits and a process for producing the same, and more particularly to a copper foil for printed circuits with improved resist adhesion and good thermal oxidation resistance on the shiny side thereof and also to a process for producing the same.

BACKGROUND OF THE INVENTION

A copper foil for printed circuits generally is laminated and bonded to a base of a synthetic resin or the like at a high temperature and a high pressure, screen-printed with a necessary circuit pattern using a resist to form an objective circuit, and then is etched with an etchant such as hydrochloric acid to remove unnecessary portions. Finally, necessary elements are soldered in place, and in this way various printed circuit boards for electronic devices are fabricated. Qualitative requirements for the copper foil for printed circuit boards differ with the side surfaces, the surface of the side to be bonded to the resin base (matt side) and the surface of the side not to be bonded to the resin base (shiny side).

Requirements for the matt side chiefly include:

(1) No possibility of oxidative discoloration during storage (corrosion protection, rust prevention);

(2) Adequate resistance to peeling from the base even after high-temperature heating, wet treatment, soldering, chemical treatment or the like (peel strength); and (3) Freedom from so-called lamination spots that can be observed after lamination to the base and etching (hydrochloric acid resistance).

Requirements for the shiny side include:

(1) Good appearance and no oxidative discoloration during storage (corrosion protection, rust prevention);

(2) Good surface propensity of being wetted by solder (solder wettability);

(3) No oxidative discoloration upon high-temperature heating (thermal oxidation resistance); and (4) Good adhesion to resist (resist adhesion).

To meet these requirements, varied processes for diverse purposes have hitherto been proposed for the treatment of copper foil for printed circuit boards, respectively of its matt and shiny sides. Paying attention to the protection of copper foil against oxidation or corrosion in particular, the present applicant previously proposed, as Japanese Patent Application Publication No. 33908/1986, a process comprising forming a zinc coating film on the shiny side of a copper foil and then forming a chromium oxidation preventive coating layer of a chromium oxide film. The same applicant also proposed and achieved many favorable results from the formation of a mixed coating film of zinc and/or zinc oxide and chromium oxide by electrolytic zinc-chromium treatment (Japanese Patent Application Publication No. 7077/1983). Furthermore, Patent Application Public Disclosure No. 294490/1990 disclosed another process which consists in forming a chromium oxide film by immersion chromate treatment and then forming a mixed coating film of zinc and/or zinc oxide and chromium oxide by said electrolytic zinc-chromium treatment for the purpose of preventing black spotting on copper foil which may be caused when it is exposed to hot, humid conditions for a long time period.

Recently, of among the properties required of the shiny side of copper foil, adhesion to resists, such as plating resist and etching resist, has become particularly important along with thermal oxidation resistance. Good resist adhesion to copper foil is a key to enhanced etching precision to keep up with the tendency toward finer patterns for printed circuits. If resist adhesion is inadequate, infiltration of the etchant such as hydrochloric acid into the region under the resist film would render it difficult to form fine circuit patterns having a very narrow width.

In the procedure of resist printing, it has been customary to mechanically polish the copper foil prior to printing so as to ensure good adhesion of resist to the copper foil.

More recently, for the saving of labor for the process and with the thinning of copper foil for higher density printed circuit boards than before, the trend is toward the omission of the mechanical polishing for enhanced resist adhesion. On the other hand, as noted above, growing importance is attached to the resist adhesion in view of the finer circuit patterns of recent and future printed circuits. Any countermeasure therefore is required which would improve the resist adhesion to thin copper foils without an increase in the number of process steps needed. Needless to say, the countermeasure should not impair not only the other properties the shiny side must have, such as thermal oxidation resistance and solder wettability, but also the many requisites of the matt side, including peel strength and resistance to hydrochloric acid attack.

OBJECT OF THE INVENTION

The object of the present invention is to establish a technology of improving the resist adhesion to the shiny side of copper foil for printed circuits without impairing the other properties on the shiny side such as corrosion protection ability, thermal oxidation resistance, and solder wettability, or the other properties required of the matt side such as peel strength and hydrochloric acid resistance, and without the need of increasing the number of process steps involved.

SUMMARY OF THE INVENTION

The present inventors have made intensive research on the basis of their judgment that, in view of the excellent properties of the conventional mixed coating film of zinc and/or zinc oxide and chromium oxide, it would be the best approach to improve the resist adhesion while making most of excellent properties of this mixed coating film. As a result, it has now been found that the foregoing object can be attained by including nickel into the mixed coating film of zinc and/or zinc oxide and chromium oxide.

Based on the above discovery, the present invention provides, in its one aspect, a copper foil for printed circuits characterized by having a coating layer which contains either or both of zinc and zinc oxide, chromium oxide and nickel at least on a shiny side of a copper foil. Preferably, in the coating layer, the amount of Zn deposited is in the range of 60 to 80 $\mu g/dm^2$, the amount of Cr deposited is in the range of 30 to 40 $\mu g/dm^2$ and the amount of Ni deposited is in the range of 5 to 20 $\mu g/dm^2$.

In a preferred embodiment, the present invention provides a copper foil for printed circuits characterized by having at its matt side a treated layer of a single metal layer or alloy layer of one or two or more metals selected from the group consisting of Cu, Cr, Ni, Fe, Co and Zn and a coating layer formed on said treated layer and containing either or both of zinc and zinc oxide, chromium oxide and nickel and on the other hand having at its shiny side a coating layer containing either or both of zinc and zinc oxide, chromium oxide and nickel.

In another aspect, present invention provides a process for imparting to at least the shiny side of a copper foil good resist adherence and thermal oxidation resistance for printed circuits characterized by electroplating at least the shiny side of the copper foil with a plating solution which contains either or both of zinc salt and zinc oxide, chromic salt and nickel salt to form a coating layer which contains either or both of zinc and zinc oxide, chromium oxide and nickel at least on the shiny side of the copper foil.

The present invention further provides a process for producing a copper foil for printed circuits characterized by electroplating at least the shiny side of a copper foil with a plating solution which contains either or both of zinc salt and zinc oxide, chromic salt and nickel salt to form a coating layer which contains either or both of zinc salt and zinc oxide, chromium oxide and nickel at least on the shiny side of the copper foil.

Electroplating is preferably conducted in the following plating solution composition and operation conditions.

$CrO_3$: 0.5–10 g/l
Zn: 0.1–10 g/l
Ni: 0.01–10 g/l
$Na_2SO_4$: 5–20 g/l
pH: 3.0–5.5
Temperature: 30–55° C.
Current density: 0.5–4.0 A/$dm_2$
Plating time: 1–5 sec.

Also in the conventional mixed coating film of zinc and/or zinc oxide and chromium oxide, resist adhesion can be improved by adjusting the amounts of zinc and chromium deposits. However, this involves a sacrifice of thermal oxidation resistance, and simultaneous attainment of the both properties has been impossible.

The coating layer according to the invention consists of zinc and/or zinc oxide (namely, either or both of zinc and zinc oxide), chromium oxide and nickel. The addition of nickel to the conventional combination of zinc and/or zinc oxide and chromium oxide improves the resist adhesion to the shiny side of a copper foil while maintaining the corrosion protection ability, thermal oxidation resistance and solder wettability of the shiny side and the peel strength, hydrochloric acid resistance and other properties of the matt side on necessary levels. Nickel enhances the resist adhesion of the shiny side without adversely affecting the outstandingly advantageous properties of the combination of zinc and/or zinc oxide and chromium oxide. Moreover, this coating layer can be formed in a single step of plating.

EXPLANATION OF EMBODIMENT OF THE INVENTION

The copper foil to be used in this invention is either electrolytic copper foil or rolled copper foil. One side surface of the copper foil is roughened and preferably that roughened side is treated so as to form thereon a single metal layer or alloy layer of one or two or more of metals selected from the group consisting of Cu, Cr, Ni, Fe, Co and Zn. When occasion demands, the roughening is preceded by or followed by ordinary copper plating as a pretreatment or finishing treatment.

The roughening as stated above is done usually on the surface of a copper foil to be bonded to a resin base, i.e., on the surface to be roughened and laminated to the base (matt side), for the purpose of increasing the peel strength of the foil after lamination with respect to the resin base. For example, the surface of the copper foil to be roughened is degreased and then subjected to copper roughening treatment by which knurly or grainy copper electrodeposits are formed on the surface. Such grainy copper electrodeposits can be easily formed by so-called burnt electrodeposition. In a typical copper roughening treatment, e.g., the following conditions may be adopted:

Copper roughening treatment

Cu: 10–25 g/l
$H_2SO_4$: 20–100 g/l
Temperature: 20–40° C.
$D_k$: 30–70 A/$dm^2$
Time: 1–5 sec.

As stated above, following the roughening treatment, it is desirable that the matt side be treated to form thereon a single metal layer or alloy layer of one or two or more metals chosen from among Cu, Cr, Ni, Fe, Co and Zn. Examples of alloy plating include Cu-Ni, Cu-Co, Cu-Ni-Co and Cu-Zn. (For details, refer to Japanese Patent Application Publication No. 9028/1981, Japanese Patent Application Public Disclosure Nos. 13971/1979, 292895/1990, and 292894/1990, and Japanese Patent Application Publication Nos. 35711/1976 and 6701/1979.) This treatment serves to dictate the final properties of the copper foil and also provides a barrier for the copper foil. For an information, an electrolyte composition and operation conditions for Cu-Zn treatment will be given below:

Cu-Zn treatment

NaCN: 10–30 g/l
NaOh: 40–100 g/l
CuCN: 60–120 g/l
$Zn(CN)_2$: 1–10 g/l
pH: 10–13 g/l
Temperature: 60–80° C.
$D_k$: 1–10 A/$dm^2$ According to this invention, a coating layer containing zinc and/or zinc oxide, chromium oxide, and nickel is formed on at least the shiny side of a copper foil, with or without the aforementioned concomitant treatment of the matt side thereof.

The coating treatment of the invention (hereinafter called a "zinc-chromium-nickel treatment") is performed in a single plating tank by electroplating using a plating solution containing at least one chromic salt chosen from among $K_2Cr_2O_7$, $Na_2Cr_2O_7$, and $CrO_3$, a zinc salt such as $ZnSO_4$. $7H_2O$ and/or ZnO, and a nickel salt such as $NiSO_4$. The process involves no extra steps compared with conventional treatments. For added electric conductivity of the treating solution, the addition of $Na_2SO_4$ is advisable. The composition of the treating solution and the conditions used under this invention are as follows:

zinc-chromium-nickel treatment $CrO_3$: 0.5–10 g/l
Zn: 0.01–10 g/l
Ni: 0.01–10 g/l
$Na_2SO_4$: 5–20 g/l
pH: 3.0–5.5

Temperature: 30–55° C.
Current density: 0.5–4.0 A/dm$_2$
Plating time: 1–5 sec.

The conditions for electrolysis to form such a mixed coating film are extremely delicate. The composition of the treating solution, bath temperature, current density, plating time, and other parameters interrelatedly influence the properties of the resulting coating film and so it is difficult to readily define an absolute combination of these conditions satisfying all requirements. The electrolytic conditions given above are stated as individually feasible ranges. Of the ranges specified, a combination of values best suited to meet particular requirements must be chosen. In brief, it is only necessary to form a coating film of uniform thickness that contains zinc and/or zinc oxide, chromium oxide and nickel and is fully densified and is closely adherent to a copper foil.

In the zinc-chromium-nickel treatment according to the invention, it is desirable to deposit Zn, Cr and Ni in amounts within the ranges of 60 to 80 $\mu$g/dm$^2$, 30 to 40 $\mu$g/dm$^2$ and 5 to 20 $\mu$g/dm$^2$, respectively, whereby the resist adhesion to the shiny side can be improved while maintaining the corrosion protection ability, thermal oxidation resistance and solder wettability of the shiny side and the peel strength, hydrochloric acid resistance and other properties of the matt side on favorable levels. The combination of the deposited amounts of Zn and Cr in the specific ranges is effective for the attainment of the above-mentioned properties. If the amount of Ni deposited is less than 5 $\mu$g/dm$^2$, its effect upon the improvement of resist adhesion is not adequate. Conversely, if the Ni amount exceeds 20$\mu$g/dm$^2$, it tends to sacrifice the highly desirable properties of the mixture of zinc and/or zinc oxide and chromium oxide. The thickness of the coating layer may differ with the matt and shiny sides, depending on the property requirements for the respective sides.

Lastly, when necessary, principally for the purpose of improving the adhesion between the copper foil and the resin base, silane treatment is conducted whereby a silane coupling agent is applied to at least the matt side of the corrosion protection coating layer. The method of application of a silane coupling agent solution may be by spraying, application by a coater, immersion or flow coating. For instance, Patent Application Publication No. 15654/1985 discloses that the adhesion between a copper foil and a resin base is increased by chromate-treating the matt side of the copper foil followed by treating with a silane coupling agent. For the details, refer to this particular publication.

When the necessity arises thereafter, the copper foil may be annealed for improving its ductility.

The copper foil thus obtained exhibits good resist adhesion and sufficient thermal oxidation resistance to remain discolored under the high temperature conditions of 180° C. for 30 minutes. Conventional processes for zinc-chromium treatment have had to sacrifice thermal oxidation resistance in order to obtain good resist adhesion and contrariwise have had to sacrifice the resist adhesion in order to obtain thermal oxidation resistance of the level of about 180° C. for about 30 minutes. This invention, on the other hand, provides a copper foil which simultaneously possesses both of these desirable properties of resist adhesion and thermal oxidation resistance. The copper foil possesses good solder wettability too. Thus the copper foil of the invention, in the process of fabricating printed circuits, shows good adhesion to resists, such as plating resist and etching resist and therefor the infiltration of the treating solution from between the resist and the base through the edges is negligible. Consequently, fine circuits having narrower width can be made with high precision. The copper foil, in addition, can withstand the thermal hysteresis it will experience during the fabrication of printed circuit boards.

EXAMPLES

An electrolytic copper foil was (1) roughened, the roughened side (matt side) was (2) Cu-Zn-treated, and both the matt and shiny sides were (3) zinc-chromium-nickel-treated. The conditions used for these three treatments were as follows:

(1) Copper roughening

Cu: 15 g/l
H$_2$SO$_4$: 50 g/l
Temperature: 30° C.
D$_K$: 50 A/dm$^2$
Time: 3 sec.

(2) Cr-Zn treatment

NaCN: 20 g/l
NaOH: 60 g/l
CuCN: 80g/l
Zn(CN)$_2$: 5 g/l
pH: 12
Temperature: 70° C.
D$_K$: 5 A/dm$^2$ (3) Zinc-chromium-nickel treatment CrO$_3$: 1.3 or 2.5 g/l
Zn: 0.5 g/l
Ni: 0 or 0.1 g/l
Na$_2$SO$_4$: 10 g/l
pH: 5.0
Temperature: 50° C.
Current density: 0.5–2.5 A/dm$^2$
Plating time: 1.5–3.6 sec.

The products thus obtained were tested, on the shiny side, to determine the deposition amount of surface film, resistance to baking test, solder wettability, and resist adhesion. For the surface analysis, after the matt side was masked by pressing with a base material, such as one marketed under the trade designation "FR-4", the masked foil was immersed in an acid to dissolve Zn, Ni, and Cr out only from the shiny side which were analyzed by atomic absorption spectroscopy. For the baking test, test pieces were placed into an oven of a preselected type, taken out, and inspected to see if the shiny side had discolored (criteria: ◯=not discolored; X=discolored). As for the solder wettability, a pressed copper foil laminated base was dipped vertically into a soldering tank using as the flux a product of San-ei Chemical Co. marketed under the trade name "JS64". The wetting angle of the solder drawn up along the laminate surface was measured. The smaller the angle the better the solderability. Resist adhesion was evaluated in the following manner. Each copper foil piece was placed on a prepreg piece, pressed together into a laminate, and the laminate was screen-printed with a given pattern using an ultraviolet-curing resist ("UR-450B" marketed by Tamura Kaken Co.). The printed laminate was passed at a predetermined speed through an ultraviolet irradiation apparatus and the resist was dried. The finished sample was immersed in 5% HCl at 50° C. for 5 minutes, water rinsed, dried, and the surface was inspected to see if the resist had peeled off or not (criteria: O=not peeled; X=peeled). With regard to the matt side, each test copper foil was securely laminated on that side to a glass-cloth-based epoxy resin board, and the peel strength and hydrochloric acid resistance were evaluated in the known and established manner. The test results are given in Table 1.

TABLE 1

| No. | $CrO_3$ (g/l) | Zn (g/l) | Ni (g/l) | Amount deposited ($\mu g/dm^2$) | | | Baking test 180° C. × 30 min. | Solder wettability | | Resist adhesion |
|---|---|---|---|---|---|---|---|---|---|---|
| | | | | Zn | Ni | Cr | | Wetting angle | Wettability | |
| 1 | 2.5 | 0.5 | — | 64 | — | 37 | X | 59.8 | 100 | O |
| 2 | 2.5 | 0.5 | — | 74 | — | 42 | O | 62.4 | 100 | X |
| 3 | 1.3 | 0.5 | — | 68 | — | 34 | X | 46.1 | 100 | O |
| 4 | 1.3 | 0.5 | — | 120 | — | 46 | O | 49.2 | 100 | X |
| 5 | 1.3 | 0.5 | 0.1 | 71 | 12 | 33 | O | 47.1 | 100 | O |
| 6 | 1.3 | 0.5 | 0.1 | 69 | 10 | 37 | O | 55.4 | 100 | O |

The test results of Table 1 show that coating films of Nos. 1 to 4 that were conventionally zinc-chromium-treated and free from nickel, or mixed coating films of zinc and/or zinc oxide and chromium oxide, failed to satisfy the both requirements of thermal oxidation resistance (in the baking test at 180° C. for 30 min.) and resist adhesion, even though the zinc and chromium contents in the films were varied. In order to satisfy either one of thermal oxidation resistance or resist adhesion requirement, the other had to be sacrificed.

It can also be seen, by contrast, that the films of Nos. 5 and 6 that were zinc-chromium-nickel-treated in conformity with this invention, or the mixed films of zinc and/or zinc oxide, chromium oxide and nickel, were superior in both thermal oxidation resistance and resist adhesion owing to the presence of nickel. Solder wettability was also good at 100%. Corrosion protection ability too was favorable.

The results evaluated above pertain to the shiny side. The properties of the matt side, such as peel strength and resistance to hydrochloric acid attack, were satisfactory with all the samples of Nos. 1 through 6 and gave substantially the same values as regards those properties.

ADVANTAGES OF THE INVENTION

The copper foil product of the present invention is improved in resist adhesion over the conventional zinc-chromium-treated copper foil products and is superior in both thermal oxidation resistance and resist adhesion. It undergoes no discoloration of the shiny side by the thermal hysteresis it experiences during the fabrication of printed circuit boards. The improved resist adhesion makes it suitable for fine circuit fabrications. Further, the coating according to this invention does not impair the other properties of the shiny side, such as oxidation protection and solder wettability, and the peel strength, hydrochloric acid resistance, etc. of the matt side. With these advantages it is expected to meet the future requirements for the copper foil for printed circuits. In addition, the coating treatment is performed by single-step plating, and therefore adds practically nothing to any cost in the process.

What we claim is:

1. A copper foil for printed circuits having a shiny side with a coating layer thereon, the coating layer comprising chromium oxide and nickel, and either or both of zinc and zinc oxide.

2. The copper foil of claim 1, wherein the amount of zinc in the coating layer is in the range of 60 to 80 $\mu g/dm^2$, the amount of chromium in the coating layer is in the range of 30 to 40 $\mu g/dm^2$, and the amount of nickel in the coating layer is in the range of 5 to 20 $\mu g/dm^2$.

3. A copper foil for printed circuits comprising:
   (a) a shiny side having a coating layer comprising chromium oxide and nickel, and either or both of zinc and zinc oxide; and
   (b) a matt side having a treated layer of either a single layer or an alloy layer of one or more metals selected from the group consisting of Cu, Cr, Ni, Fe, Co and Zn, and a coating layer formed on the treated layer, the coating layer comprising chromium oxide and nickel, and either or both of zinc and zinc oxide.

4. The copper foil of claim 3, wherein the amount of zinc in the coating layer of the matt side and shiny side is in the range of 60 to 80 $\mu g/dm^2$, the amount of chromium in the coating layer of the matt side and shiny side is in the range of 30 to 40 $\mu g/dm^2$, and the amount of nickel in the coating layer of the matt side and shiny side is in the range of 5 to 20 $\mu g/dm^2$.

* * * * *